(12) United States Patent
DeNatale et al.

(10) Patent No.: US 8,847,409 B1
(45) Date of Patent: Sep. 30, 2014

(54) COMPLIANT MICRO-SOCKET HYBRIDIZATION METHOD

(71) Applicant: Teledyne Scientific & Imaging, LLC, Thousand Oaks, CA (US)

(72) Inventors: Jeffrey F. DeNatale, Thousand Oaks, CA (US); Yu-Hua K. Lin, Oak Park, CA (US); Philip A. Stupar, Oxnard, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 13/908,409

(22) Filed: Jun. 3, 2013

(51) Int. Cl.
H01L 23/48 (2006.01)
H01L 23/528 (2006.01)
H01L 21/768 (2006.01)

(52) U.S. Cl.
CPC ........ H01L 21/76804 (2013.01); H01L 23/528 (2013.01)
USPC ............................ 257/777; 257/780; 257/764

(58) Field of Classification Search
CPC ............ H01L 2224/05551; H01L 2224/05644
USPC .......................................... 257/777–781, 764
See application file for complete search history.

(56) References Cited

U.S. PATENT DOCUMENTS

| | | | |
|---|---|---|---|
| 4,774,632 A | 9/1988 | Neugebauer | 361/386 |
| 4,918,811 A | 4/1990 | Eichelberger et al. | 29/840 |
| 4,924,353 A | 5/1990 | Patraw | 361/400 |
| 5,016,138 A | 5/1991 | Woodman | 361/381 |
| 5,040,994 A | 8/1991 | Nakamoto et al. | 439/76 |
| 5,250,843 A | 10/1993 | Eichelberger | 257/692 |
| 5,325,265 A | 6/1994 | Turlik et al. | 361/702 |
| 5,435,734 A | 7/1995 | Chow | 439/69 |
| 5,882,221 A | 3/1999 | Nguyen et al. | 439/331 |
| 6,272,741 B1 | 8/2001 | Kennedy et al. | 29/830 |
| 6,971,160 B1 | 12/2005 | Welch et al. | 29/832 |
| 7,053,496 B2 | 5/2006 | Stone | 257/798 |
| 7,145,219 B2 | 12/2006 | Faris | 257/618 |
| 7,429,497 B2 | 9/2008 | Stone | 438/106 |
| 8,222,734 B2 | 7/2012 | Moriyama et al. | 257/724 |
| 8,293,547 B2 | 10/2012 | Karp et al. | 438/16 |
| 2004/0212383 A1 | 10/2004 | Yanagisawa et al. | 324/755 |
| 2008/0017964 A1 | 1/2008 | Schott et al. | 257/680 |
| 2010/0054671 A1 | 3/2010 | Ban et al. | 385/88 |
| 2011/0031603 A1* | 2/2011 | Su et al. | 257/690 |

* cited by examiner

*Primary Examiner* — Kevin M Picardat
*Assistant Examiner* — Paul Patton
(74) *Attorney, Agent, or Firm* — Koppel, Patrick, Heybl & Philpott

(57) ABSTRACT

A hybridization method comprises providing a first IC, depositing a first metal layer over electrical contacts on the IC, depositing an insulating layer over the first metal layer and contacts, providing recesses in the insulating layer above each contact, and depositing metal such that the sidewalls of the recesses provide electrical continuity between the top of each recess and the electrical contact it is above. The recesses are backfilled with a sacrificial planarization material and planarized, and a second metal layer is deposited, patterned and etched over each backfilled recess to form openings over each recess and to separate the pixels. The sacrificial planarization material is removed to form compliant structures overhanging the recesses and thereby creating micro-sockets capable of receiving corresponding conductive pins associated with a mating IC. Electrical contact between the first and mating ICs is accomplished through shear between the pins and the micro-sockets.

42 Claims, 2 Drawing Sheets

COMPLIANT MICRO-SOCKET HYBRIDIZATION METHOD

BACKGROUND OF THE INVENTION

1. Field of the Invention

This invention relates generally to methods of interconnecting multiple chips to form a hybrid device, and more particularly to a hybridization method which employs compliant micro-sockets to effect the interconnections between chips.

2. Description of the Related Art

A "hybrid" device typically contains two or more separately-fabricated integrated circuits (ICs or "chips") within a common package. Generally, the separate chips must be interconnected in some fashion to provide a functional device. The technique used to facilitate the interconnection is commonly referred to as "hybridization".

The chips within a given hybrid are often in a 'stacked' arrangement, with an interconnection means employed between the chips to connect contact pads on the top of the lower chip with corresponding contact pads on the bottom of the upper chip. One common hybridization technique uses indium bumps deposited on both chips' mating surfaces. The chips are then brought into contact with each other such that the bumps are pressed together, causing them to deform and bond together. However, there is no means of ensuring the alignment of the respective indium bumps; in practice, the bumps are often out of alignment and slip off each other.

Another problem with this conventional hybridization technique is 'run-out'. An indium bump is typically around 10 μm in diameter before being deformed as described above, with a target compression of about 50%. When pressed together, the diameter of the bump(s) expands, which is known as run-out. However, the indium can deform too much or in unpredictable directions, which can lead to shorts when adjacent contacts are in close proximity to each other. For example, a hybrid detector device typically includes a first chip containing a large array of pixels, each of which must interface with a second, control IC. The distance between the centerlines of adjacent pixels is referred to as 'pixel pitch'. As pixel pitch drops below 10 μm, both indium run-out and hybridization alignment can make existing methods of interconnecting the chips unsuitable.

SUMMARY OF THE INVENTION

A compliant micro-socket hybridization method is disclosed which addresses the problems noted above, enabling small pixel pitch hybridizations with self-alignment and run-out protection.

The present method forms compliant micro-sockets on an IC to enable it to be joined to a mating IC to form a hybrid device. The method comprises:

providing a first IC, the surface of which includes at least one electrical contact for connection to a mating IC;

depositing and patterning a first metal layer over the at least one electrical contact;

depositing an insulating layer on the first patterned metal layer and over the at least one electrical contact;

patterning and etching the insulating layer to provide recesses above each of the electrical contacts;

depositing metal such that the sidewalls of the recesses and the immediately surrounding areas are coated with the metal such that electrical continuity is provided between the top of each recess and the electrical contact it is above;

backfilling the recesses with a sacrificial planarization material, which is then planarized;

depositing metal on the planarization material to form a second metal layer over each of the backfilled recesses;

patterning and etching the second metal layer to form openings over each of the recesses; and removing the sacrificial planarization material to form mechanically compliant structures overhanging the recesses and thereby creating micro-sockets capable of receiving corresponding conductive pins associated with a mating IC.

When so arranged, electrical contact between the first and mating ICs is accomplished through shear between the conductive pins on the mating IC and the micro-sockets of the first IC. The method enables a degree of self-alignment between socket and pin during hybridization, to accommodate alignment error. Shorting of adjacent pixels upon hybridization is reduced or eliminated with the use of recessed sockets, enabling very small pixel pitch (~5 μm) to be realized.

These and other features, aspects, and advantages of the present invention will become better understood with reference to the following drawings, description, and claims.

DETAILED DESCRIPTION OF THE INVENTION

Figure 1A:
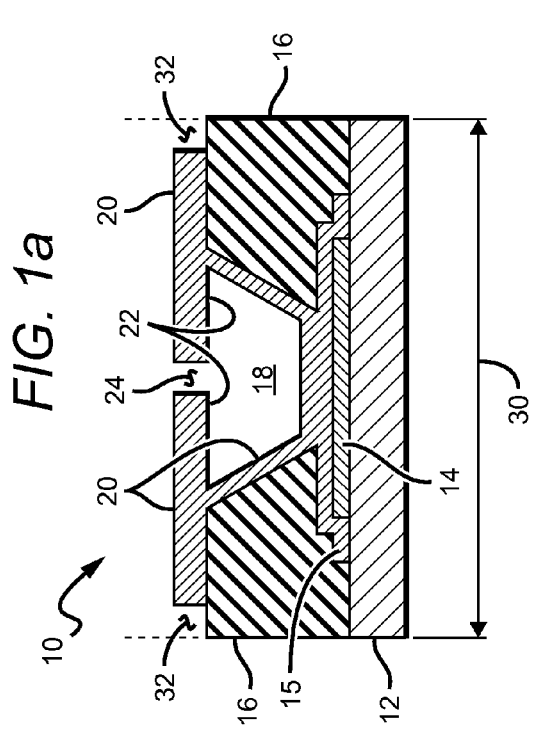
FIGS. 1a and 1b are sectional and plan views, respectively, of a compliant micro-socket in accordance with the present hybridization method.
Figure 1B:
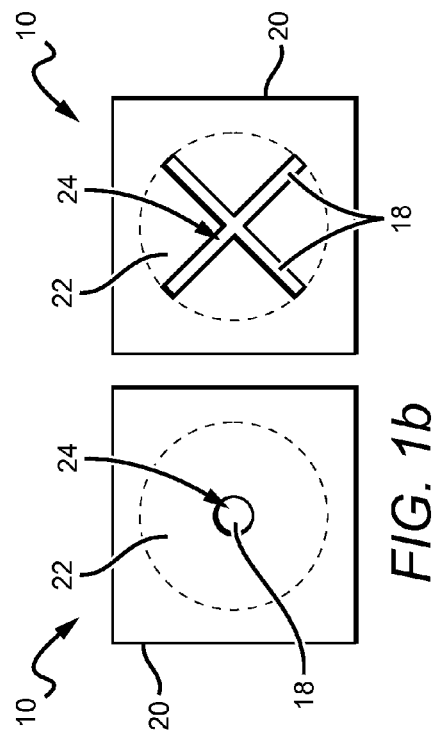

Sectional and plan views of a compliant micro-socket in accordance with the present hybridization method are shown in FIGS. 1a and 1b. The micro-socket 10 is fabricated on a first IC 12, such as a control IC or a readout IC (ROIC), the surface of which includes at least one electrical contact 14 intended for connection to a mating IC (not shown). Note that while the exemplary embodiment described below and shown in FIGS. 1a and 1b depict a single micro-socket over a single electrical contact, in practice there would typically be a plurality of such micro-sockets over respective electrical contacts.

Micro-socket 10 includes a first metal layer 15 over electrical contact 14. An insulating layer 16, suitably $SiO_2$, is on first metal layer 15 and electrical contact 14, which has been patterned and etched to provide a recess 18 in the insulating layer over the electrical contact. Metal 20 is coated on the sidewalls of recess 18 and on the areas immediately surrounding the recesses, which is sufficiently conformal to provide electrical continuity between the top of each recess and the electrical contact it is above. Metal overhangs 22 extend at least partially over each recess, and openings 24 are provided in each overhang such that mechanically compliant micro-sockets 10 are formed which are capable of receiving corresponding conductive pins (not shown) associated with a mating IC.

Openings 24 can have any of a number of different patterns; a small central hole or a narrow slotted opening as shown in FIG. 1b is preferred. The openings suitably have a nominal width of ~0.5 μm. Assuming that each micro-socket represents a corresponding pixel, a pixel pitch 30 of, for example, <10 μm (suitably 5 μm), can be accommodated with the present micro-sockets. There is preferably an isolation region 32 between adjacent conductive regions 20; these regions suitably have a nominal width of ~0.5 μm.

A mating IC would have conductive pins positioned to align with openings 24. IC 12 and a mating IC are hybridized by forcing the conductive pins through openings 24, such that an interconnection is established between pin and socket (and thus to contact 14) through shear between each pin and its corresponding compliant micro-socket. The design of the present compliant micro-socket enables a degree of self-alignment during hybridization of socket and pin, such that some alignment error may be accommodated.

The present compliant micro-socket may be used with any hybrid device in which two or more stacked ICs must be interconnected. For one possible application, first IC 12 is a control or readout IC and the mating IC is a detector array. Shorting of adjacent pixels during hybridization is substantially reduced or eliminated with the use of compliant micro-sockets as described herein.

Figure 2:
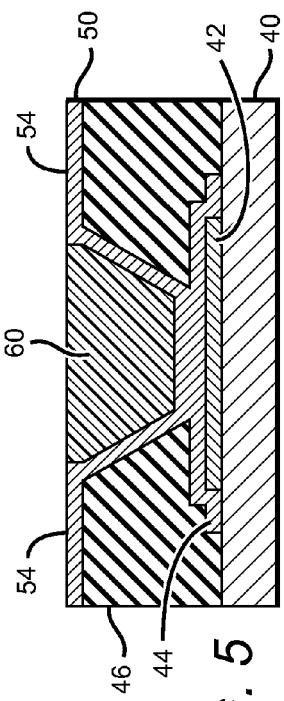
FIGS. 2-7 depict a method of forming compliant micro-sockets in accordance with the present hybridization method.
Figure 3:
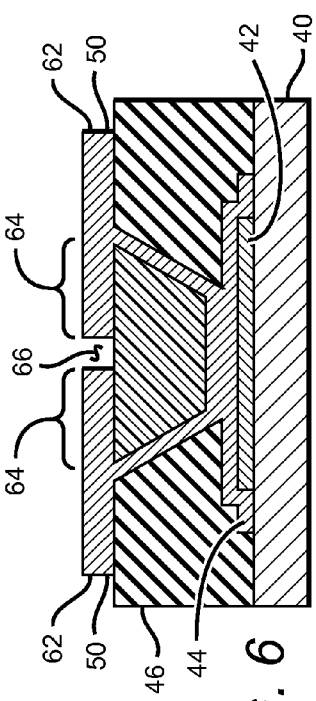

Sectional views illustrating one possible method of forming compliant micro-sockets to enable a first IC to be joined to a mating IC to form a hybrid device are shown in FIGS. 2-7. In FIG. 2, a first IC 40 includes at least one electrical contact 42 (typically aluminum) on its surface, for connection to a mating IC (not shown). A first metal layer 44 is deposited and patterned over the at least one electrical contact (a single contact 42 shown in the present example); first metal layer 44 is preferably titanium-gold-titanium (Ti—Au—Ti) or chrome-gold-chrome (Cr—Au—Cr).

This is followed by the deposition of an insulating layer 46 on metal layer 44 and over electrical contact 42. Insulating layer 46 is preferably $SiO_2$ (suitably ~3 μm thick), $Si_3N_4$, or silicon oxynitride, though other insulating materials such as a parylene might also be used. Insulating layer 46 is preferably deposited using Plasma Enhanced Chemical Vapor Deposition (PECVD).

Photoresist is then deposited and patterned on insulating layer 46, and the photoresist-masked IC is etched to provide recesses 48 in the insulating layer above each electrical contact. The photoresist used to pattern insulating layer 46 is then stripped, leaving the structure shown in FIG. 3. Etching the photoresist-masked IC preferably comprises performing an anisotropic deep etch, which may be followed by performing an isotropic undercut.

Figure 4:
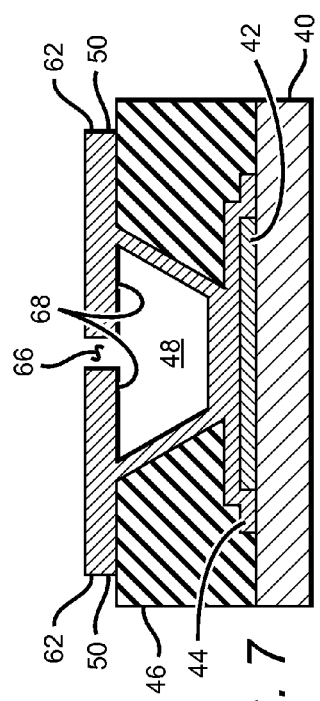

In FIG. 4, metal 50 is deposited such that the sidewalls 52 of recesses 48 and the areas 54 immediately surrounding the recesses are coated, preferably conformally, with metal such that electrical continuity is provided between the top of each recess and the electrical contact (42) it is above. Metal 50 may be made from, for example, titanium-gold (Ti—Au) or titanium-platinum (Ti—Pt); the Ti acts as an adhesion layer, which may be deposited via sputtering or evaporation. If Ti—Au, the Au is preferably deposited by sputtering, with the Ti having a thickness of at least 20 Å and the Au having a thickness of at least 500 Å. If Ti—Pt, the Pt is preferably deposited using ALD, with the Ti having a thickness of at least 50 Å and the Pt having a thickness of at least 250 Å.

Figure 5:
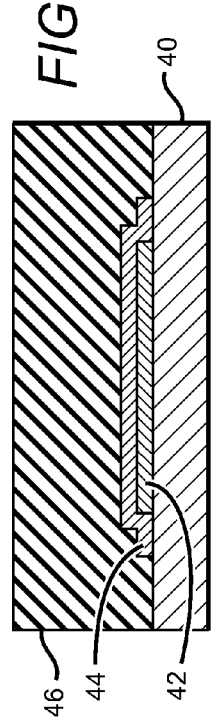

In FIG. 5, the recesses 48 are backfilled with a sacrificial planarization material 60. Planarization material 60 is preferably a vapor-deposited polymer, such as a parylene. The planarization material might also be, for example, a curable, liquid-dispensed planarization material such as PC3 resin, or photoresist. The planarization material is then preferably planarized, which helps to control lithographic patterning. As part of the planarization process, metal areas 54 are at least partially exposed to allow electrical contact to subsequent metal layers (such as layer 62, discussed below).

Figure 6:
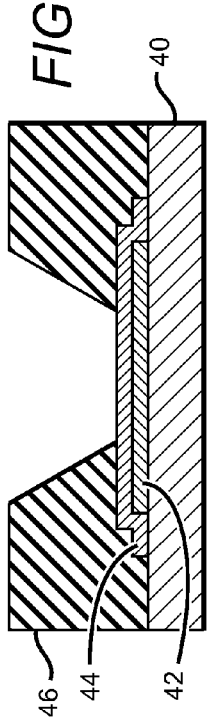

In FIG. 6, a metal is deposited on planarization material 60 as a second metal layer 62, which extends over each of the backfilled recesses and metal areas 54, such that there is electrical continuity between second metal layer 62 and electrical contact 42. Metal layer 62 is then patterned and etched to form a metal overhang 64 with an opening 66 over each recess. Metal 62 may be made from, for example, chromium-gold (Cr—Au) or Ti—Au. If Cr—Au, the Cr preferably has a thickness of at least 20 Å and the Au a thickness of at least 1000 Å. If Ti—Au, the Ti preferably has a thickness of at least 20 Å and the Au a thickness of at least 1000 Å. The patterning and etching of metal layer 62 is preferably further arranged to electrically isolate the metal over each of the recesses from the metal over the neighboring recesses, which enables the pixels to be easily separated. The etching of the second metal layer is preferably performed using reactive ion etching, sputtering or ion milling.

The geometry of metal overhangs 64 can be tailored depending on the desired hybridization force, to provide a tight fit upon shear. As noted above, openings 66 might take the form of a small central hole or a narrow slotted opening; a cross-shaped opening may be preferred if more compliance is needed, as might be the case when hybridizing large arrays. The thickness of the metal overhangs should be thick enough to offer some resistance to the conductive pins that will mate with the micro-sockets, but thin enough to be adequately compliant such that the hybridization forces do not damage the mating ICs. The thickness of the Au affects how stiff the metal overhangs are. The size of the recess and how far metal 64 extends over the recess also affect the stiffness. The optimum stiffness depends in part on how many pin-in-socket interconnects are to be made, as well as on other factors associated with the geometry and materials chosen. For example, a stiffer metal on the overhang could have equivalent stiffness at a smaller thickness. A suitable thickness range for the metal overhangs is 1000 Å to 4000 Å for Au.

Figure 7:
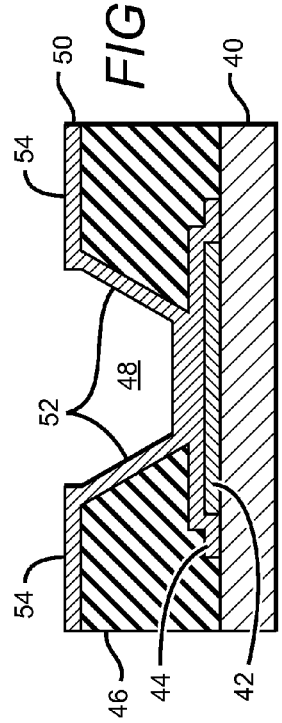

In FIG. 7, the sacrificial planarization material 60 is released/removed to form mechanically compliant structures 68 which overhang the recesses 48 and thereby create micro-sockets capable of receiving corresponding conductive pins associated with a mating IC. Sacrificial planarization material 60 may be removed using an $O_2$ plasma etch or solvents that dissolve the sacrificial planarization material through openings 66 in second metal layer 62. For example, if insulating layer 46 is $SiO_2$, an $O_2$ plasma etch is preferably used to remove organic planarization materials (such as a parylene, PC3 resin, photoresist, PMGI, etc.). If insulating layer 46 is a parylene, the planarization material can be removed with, for example, acetone, developer, or hot 1165 remover.

The resulting compliant micro-socket is indium-free, enabling it to be compatible with processes that require a higher temperature (such as a post-hybridization bake) than can be tolerated by an indium-based interconnect. In addition to the self-alignment benefits described above, the present micro-socket is also tolerant to variations in the height of the conductive pins that extend from the mating IC, due to the presence of the insulating layer (16 in FIG. 1a).

The conductive pins on the mating IC are preferably gold. It should be noted that with the metal-to-metal contact resulting from the shear between pin and micro-socket, metal-to-metal bonding can occur, particularly when soft metals such as gold are used. A very small pixel pitch of 5 μm or less may be achievable with the present micro-socket.

Figure 8:
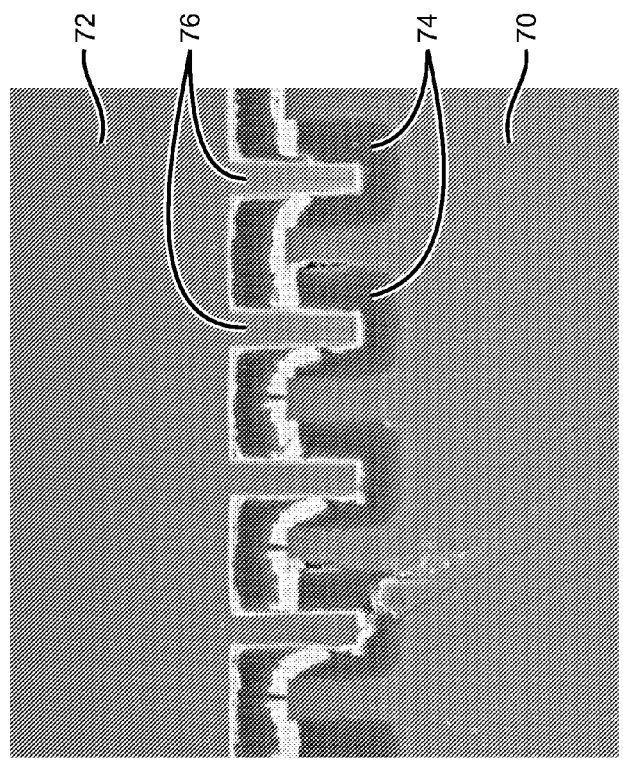
FIG. 8 is a photomicrograph of mechanical surrogate first and mating ICs which have been hybridized in accordance with the present hybridization method.

FIG. 8 is a photomicrograph showing a small portion of mechanical surrogates for a first IC 70 and a mating IC 72. Several compliant micro-sockets 74 as described herein are located on the first IC, and corresponding conductive pins 76 are located on the mating IC. The first and mating ICs have been hybridized by aligning conductive pins 76 with micro-sockets 74, and then forcing them through the openings in the tops of their corresponding micro-sockets. The resulting shear between pins and micro-sockets establishes the desired electrical contacts.

The recessed nature of the present micro-sockets serves to prevent run-out, as well as shorting between adjacent contacts and/or pins. All micro-socket process steps are based on standardized clean room processes. This facilitates manufacturability, provides good control of socket fabrication parameters due to decoupled process steps (e.g., forming recessed sockets and sidewalls first, prior to forming the metal overhangs), and enables processing of large area arrays with very small pixels.

The present compliant micro-sockets could be used with any hybrid application in which two or more ICs must be stacked and interconnected. Though the description herein concerns a multi-pixel detector array application, many other possible applications are envisioned. For example, the present micro-sockets are well-suited to a vertically integrated CMOS application that requires CMOS ICs to be stacked. The very small pitch achievable with the present design enables a higher density of layer-to-layer interconnects than might otherwise be possible. Another possible application is a hybrid assembly of ICs made from dissimilar materials or circuit processes. Note that, as used herein, an "IC" can be any device which has electrical functionality. For example, an IC can be an integrated MEMS device or integrated passive elements.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A method of forming compliant micro-sockets on an integrated circuit (IC) to enable said IC to be joined to a mating IC to form a hybrid device, comprising:
   providing a first IC, the surface of which includes at least one electrical contact for connection to a mating IC;
   depositing and patterning a first metal layer over said at least one electrical contact;
   depositing an insulating layer on said first patterned metal layer and over said at least one electrical contact;
   patterning and etching said insulating layer to provide recesses in said insulating layer above each of said electrical contacts;
   depositing metal such that the sidewalls of said recesses and the areas immediately surrounding said recesses are coated with said metal such that electrical continuity is provided between the top of each recess and the electrical contact it is above;
   backfilling said recesses with a sacrificial planarization material;
   planarizing said planarization material such that said metal in the areas immediately surrounding said recesses is at least partially exposed;
   depositing metal on said planarization material to form a second metal layer over each of said backfilled recesses such that there is electrical continuity between said second metal layer and said at least one electrical contact;
   patterning and etching said second metal layer to form openings in said second metal layer over each of said recesses; and
   removing the sacrificial planarization material to form mechanically compliant structures overhanging the recesses and thereby create micro-sockets capable of receiving corresponding conductive pins associated with a mating IC.

2. The method of claim 1, wherein said first metal layer comprises titanium-gold-titanium (Ti—Au—Ti) or chrome-gold-chrome (Cr—Au—Cr).

3. The method of claim 1, wherein said insulating layer is $SiO_2$, $Si_3N_4$, or silicon oxynitride.

4. The method of claim 1, wherein said insulating layer is deposited using Plasma Enhanced Chemical Vapor Deposition (PECVD).

5. The method of claim 1, wherein patterning and etching said insulating layer comprises:
   depositing and patterning photoresist on said insulating layer; and
   etching said photoresist-masked IC such that said recesses in said insulating layer above said first IC's electrical contacts are created.

6. The method of claim 5, wherein etching said photoresist-masked IC comprises performing an anisotropic deep etch.

7. The method of claim 5, wherein etching said photoresist-masked IC comprises:
   performing an anisotropic deep etch; and
   performing an isotropic undercut etch.

8. The method of claim 1, wherein said metal deposited on the sidewalls of said recesses and the areas immediately surrounding said recesses comprises titanium-gold (Ti—Au).

9. The method of claim 8, wherein said Au is deposited by sputtering, said deposited Ti having a thickness of at least 20 Å and said deposited Au having a thickness of at least 500 Å.

10. The method of claim 1, wherein said metal deposited on the sidewalls of said recesses and the areas immediately surrounding said recesses comprises titanium-platinum (Ti—Pt).

11. The method of claim 10, wherein said Pt is deposited using atomic layer deposition (ALD), said Ti having a thickness of at least 50 Å and said Pt having a thickness of at least 250 Å.

12. The method of claim 1, wherein said planarization material is a curable, liquid-dispensed planarization material.

13. The method of claim 12, wherein said planarization material is PC3 resin or photoresist.

14. The method of claim 1, wherein said planarization material is a vapor-deposited polymer.

15. The method of claim 14, wherein said planarization material is a parylene.

16. The method of claim 1, wherein said metal deposited on said planarization material to form a second metal layer over each of said backfilled recesses comprises chromium-gold (Cr—Au) or titanium-gold (Ti—Au).

17. The method of claim 16, wherein said metal is Cr—Au, said Cr having a thickness of at least 20 Å and said Au having a thickness of at least 1000 Å.

18. The method of claim 16, wherein said metal is Ti—Au, said Ti having a thickness of at least 20 Å and said Au having a thickness of at least 1000 Å.

19. The method of claim 1, wherein said step of patterning and etching said second metal layer to form openings in said second metal layer is further arranged to electrically isolate the metal over each of said recesses from the metal over neighboring recesses.

20. The method of claim 19, wherein said etching of said second metal layer is performed using reactive ion etching, sputtering or ion milling.

21. The method of claim 1, wherein said openings formed in said overhangs comprise a pattern selected from a group comprising a small central hole and a narrow slotted opening.

22. The method of claim 1, wherein said sacrificial planarization material is removed using an $O_2$ plasma etch or solvents that dissolve the sacrificial planarization material through said openings in said second metal layer.

23. The method of claim 1, further comprising:
providing said mating IC, said mating IC including conductive pins positioned to align with the openings over said recesses; and
hybridizing said first and mating ICs by forcing said conductive pins through said openings such that electrical contact is established through shear between each pin and its corresponding compliant micro-socket.

24. The method of claim 1, wherein said first IC is a control IC and said mating IC is a detector array.

25. The method of claim 24, wherein said detector array has a pixel pitch of <10 μm.

26. The method of claim 23, wherein said conductive pins are connected to respective contact pads in said mating IC.

27. An integrated circuit (IC) intended for joining to a mating IC to form a hybrid device, comprising:
an IC, the surface of which includes at least one electrical contact for connection to a mating IC;
a first metal layer over said at least one electrical contact;
an insulating layer on said first metal layer and over said at least one electrical contact which has been patterned and etched to provide recesses in said insulating layer above each of said electrical contacts;
metal coated on the sidewalls of said recesses and on the areas immediately surrounding said recesses which is sufficiently conformal to provide electrical continuity between the top of each recess and the electrical contact it is above;
metal overhangs extending at least partially over each of said recesses; and
openings in each of said overhangs such that mechanically compliant micro-sockets are formed which are capable of receiving corresponding conductive pins associated with a mating IC.

28. The IC of claim 27, wherein said first metal layer comprises titanium-gold-titanium (Ti—Au—Ti) or chrome-gold-chrome (Cr—Au—Cr).

29. The IC of claim 27, wherein said insulating layer is $SiO_2$ or $Si_3N_4$ or silicon oxynitride.

30. The IC of claim 27, wherein said metal coated on the sidewalls of said recesses and the areas immediately surrounding said recesses comprises titanium-gold (Ti—Au).

31. The IC of claim 30, wherein the thickness of said Ti coated on said sidewalls is at least 20 Å and the thickness of said Au coated on said sidewalls is at least 500 Å.

32. The IC of claim 30, wherein said metal conformally coated on the sidewalls of said recesses and the areas immediately surrounding said recesses comprises titanium-platinum (Ti—Pt).

33. The IC of claim 32, wherein the thickness of said Ti coated on said sidewalls is at least 50 Å and the thickness of said Pt coated on said sidewalls is at least 250 Å.

34. The IC of claim 27, wherein said metal overhangs comprise chromium-gold (Cr—Au) or titanium-gold (Ti—Au).

35. The IC of claim 34, wherein said metal overhangs are Cr—Au, said Cr having a thickness of at least 20 Å and said Au having a thickness of at least 1000 Å.

36. The IC of claim 34, wherein said metal overhangs are Ti—Au, said Ti having a thickness of at least 20 Å and said Au having a thickness of at least 1000 Å.

37. The IC of claim 27, wherein said IC is patterned and etched to electrically isolate neighboring micro-sockets.

38. The IC of claim 27, wherein said openings formed in said overhangs comprise a pattern selected from a group comprising a small central hole and a narrow slotted opening.

39. The IC of claim 27, further comprising a mating IC, said mating IC including conductive pins positioned to align with the openings in said overhangs such that when said conductive pins are forced through said openings, electrical contact is established through shear between each pin and its corresponding compliant micro-socket.

40. The IC of claim 39, wherein said first IC is a control IC and said mating IC is a detector array.

41. The IC of claim 40, wherein said detector array has a pixel pitch of <10 μm.

42. The IC of claim 39, wherein said conductive pins are connected to respective contact pads in said mating IC.

* * * * *

UNITED STATES PATENT AND TRADEMARK OFFICE
CERTIFICATE OF CORRECTION

PATENT NO. : 8,847,409 B1  
APPLICATION NO. : 13/908409  
DATED : September 30, 2014  
INVENTOR(S) : Jeffrey F. DeNatale et al.

Page 1 of 1

It is certified that error appears in the above-identified patent and that said Letters Patent is hereby corrected as shown below:

IN THE SPECIFICATION:

Column 1, Line 4, insert the following paragraph before: "BACKGROUND OF THE INVENTION"

--GOVERNMENT LICENSE RIGHTS

This invention was made with Government support under contract number W31P4Q-09-C-0513 awarded by the Department of Defense/Army. The Government has certain rights in the invention.--

Signed and Sealed this  
Seventeenth Day of February, 2015

Michelle K. Lee  
*Deputy Director of the United States Patent and Trademark Office*